(12) United States Patent
Low et al.

(10) Patent No.: US 8,923,004 B2
(45) Date of Patent: Dec. 30, 2014

(54) MICROELECTRONIC PACKAGES WITH SMALL FOOTPRINTS AND ASSOCIATED METHODS OF MANUFACTURING

(75) Inventors: Peng Wang Low, Singapore (SG); Leng Cher Kuah, Singapore (SG); Hong Wan Ng, Singapore (SG); Seng Kim Ye, Singapore (SG); Chye Lin Toh, Singapore (SG)

(73) Assignee: Micron Technology, Inc., Boise, ID (US)

( * ) Notice: Subject to any disclaimer, the term of this patent is extended or adjusted under 35 U.S.C. 154(b) by 1300 days.

(21) Appl. No.: 12/184,113

(22) Filed: Jul. 31, 2008

(65) Prior Publication Data
US 2010/0027233 A1 Feb. 4, 2010

(51) Int. Cl.
| | | |
|---|---|---|
| H05K 7/02 | (2006.01) | |
| B23P 11/00 | (2006.01) | |
| H01L 23/00 | (2006.01) | |
| H01L 25/065 | (2006.01) | |
| H01L 25/03 | (2006.01) | |
| H01L 21/56 | (2006.01) | |
| H01L 23/31 | (2006.01) | |
| H01L 25/18 | (2006.01) | |

(52) U.S. Cl.
CPC ... *H01L 25/0657* (2013.01); *H01L 2924/01074* (2013.01); *H01L 24/32* (2013.01); *H01L 2924/15311* (2013.01); *H01L 2224/32225* (2013.01); *H01L 2924/01006* (2013.01); *H01L 2225/06575* (2013.01); *H01L 2224/92247* (2013.01); *H01L 2225/06517* (2013.01); *H01L 2225/06555* (2013.01); *H01L 2224/92* (2013.01); *H01L 2224/73265* (2013.01); *H01L 25/03* (2013.01); *H01L 2924/14* (2013.01); *H01L 2224/16225* (2013.01); *H01L 2224/32145* (2013.01); *H01L 21/565* (2013.01); *H01L 24/48* (2013.01); *H01L 2224/48227* (2013.01); *H01L 2924/01033* (2013.01); *H01L 2225/0651* (2013.01); *H01L 23/3128* (2013.01); *H01L 2224/48091* (2013.01); *H01L 25/18* (2013.01); *H01L 23/3135* (2013.01); *H01L 2924/10253* (2013.01)

USPC ........... 361/760; 361/715; 361/719; 361/761; 29/832; 29/836; 29/841; 29/739; 257/686; 257/777; 257/778; 438/106; 438/108; 438/109

(58) Field of Classification Search
USPC ......... 361/715, 719, 732, 748–752, 760–767, 361/792–794; 174/250–266, 521, 538; 29/830–832, 842, 846, 850–852; 257/723, 685, 686, 777, 785, 786, 787, 257/E23.042, E23.024, E25.031, E25.032, 257/E27.144; 438/26, 66, 67, 107, 109, 438/113, 118, 455–459

See application file for complete search history.

(56) References Cited

U.S. PATENT DOCUMENTS 6,157,080 A * 12/2000 Tamaki et al. ............... 257/738
6,339,254 B1 * 1/2002 Venkateshwaran et al. .. 257/686

(Continued)

*Primary Examiner* — Michail V Datskovskiy
(74) *Attorney, Agent, or Firm* — Perkins Coie LLP (57) ABSTRACT

Several embodiments of stacked-die microelectronic packages with small footprints and associated methods of manufacturing are disclosed herein. In one embodiment, the package includes a substrate, a first die carried by the substrate, and a second die between the first die and the substrate. The first die has a first footprint, and the second die has a second footprint that is smaller than the first footprint of the first die. The package further includes an adhesive having a first portion adjacent to a second portion. The first portion is between the first die and the second die, and the second portion being between the first die and the substrate.

6 Claims, 5 Drawing Sheets

(56) References Cited

U.S. PATENT DOCUMENTS

| | | | |
|---|---|---|---|
| 6,353,263 B1 * | 3/2002 | Dotta et al. | 257/777 |
| 6,621,172 B2 * | 9/2003 | Nakayama et al. | 257/787 |
| 6,650,019 B2 * | 11/2003 | Glenn et al. | 257/777 |
| 6,664,643 B2 * | 12/2003 | Emoto | 257/777 |
| 6,853,064 B2 * | 2/2005 | Bolken et al. | 257/686 |
| 6,958,259 B2 * | 10/2005 | Shibue | 438/108 |
| 7,005,577 B2 * | 2/2006 | Lee et al. | 174/538 |
| 7,008,822 B2 * | 3/2006 | Bolken et al. | 438/109 |
| 7,091,623 B2 * | 8/2006 | Tsai et al. | 257/783 |
| 7,227,086 B2 * | 6/2007 | Lee et al. | 174/521 |
| 7,247,934 B2 * | 7/2007 | Pu | 257/686 |
| 7,282,390 B2 * | 10/2007 | Tan et al. | 438/109 |
| 7,374,967 B2 * | 5/2008 | Lee | 438/109 |
| 7,410,832 B2 * | 8/2008 | Lee et al. | 438/118 |
| 7,521,809 B2 * | 4/2009 | Birzer et al. | 257/777 |
| 7,598,606 B2 * | 10/2009 | Chow et al. | 257/686 |
| 7,723,852 B1 * | 5/2010 | Kim et al. | 257/777 |
| 7,906,855 B1 * | 3/2011 | Kim et al. | 257/777 |
| 7,956,449 B2 * | 6/2011 | Lee et al. | 257/686 |
| 8,102,040 B2 * | 1/2012 | Chow et al. | 257/686 |
| 8,120,156 B2 * | 2/2012 | Camacho et al. | 257/686 |
| 2005/0156323 A1 * | 7/2005 | Tokunaga | 257/778 |
| 2006/0102994 A1 * | 5/2006 | Pu | 257/686 |
| 2006/0197207 A1 * | 9/2006 | Chow et al. | 257/686 |
| 2007/0170570 A1 * | 7/2007 | Camacho et al. | 257/686 |
| 2007/0194424 A1 * | 8/2007 | Camacho et al. | 257/686 |
| 2008/0211089 A1 * | 9/2008 | Khan et al. | 257/723 |
| 2009/0001599 A1 * | 1/2009 | Foong et al. | 257/777 |

* cited by examiner

MICROELECTRONIC PACKAGES WITH SMALL FOOTPRINTS AND ASSOCIATED METHODS OF MANUFACTURING

TECHNICAL FIELD

The present disclosure is related to stacked-die microelectronic packages with small footprints and associated methods of manufacturing.

BACKGROUND

Microelectronic dies are typically manufactured on semiconductor wafers or other types of workpieces using sophisticated equipment and processes. The individual dies generally include a plurality of bond-pads coupled to integrated circuits. The bond-pads provide external contacts through which supply voltage, data signals, and other electrical signals are transmitted to/from the integrated circuits. The bond-pads are usually very small, and they are typically arranged in dense arrays separated by a fine pitch. The wafers and dies can also be quite delicate. As a result, the dies are packaged for protection and for connecting the bond-pads to arrays of larger terminals that can be soldered to printed circuit boards.

Figure 1:
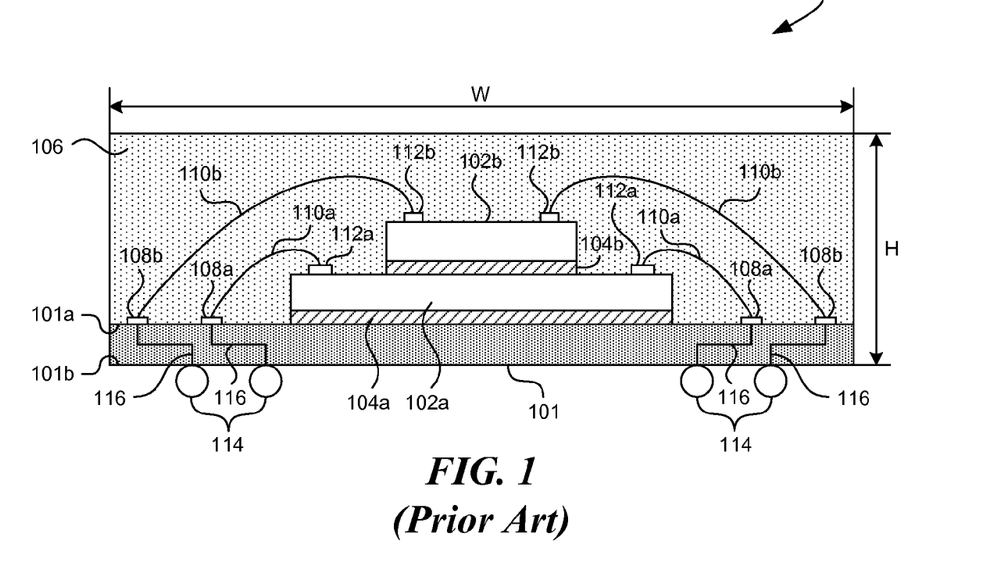
FIG. 1 is a partially schematic cross-sectional view of a microelectronic device package in accordance with the prior art.

One challenge of manufacturing microelectronic devices is to cost effectively package the dies. Electronic product manufacturers are under continuous pressure to reduce the size of their products. Accordingly, microelectronic die manufacturers seek to reduce the size of the packaged dies incorporated into the electronic products. FIG. 1 illustrates an existing microelectronic device package 100 having stacked dies. As shown in FIG. 1, the package 100 includes a substrate 101 carrying a first die 102a and a second die 102b encapsulated in an encapsulant 106. The first die 102a has a larger footprint than the second die 102b. A first adhesive 104a couples the first die 102a to a first surface 101a of the substrate 101. A second adhesive 104b couples the second die 102b to the first die 102a. The substrate 101 also includes first terminals 108a that are inboard of second terminals 108b on the first surface 101a. First wirebonds 110a extend between first terminals 108a on the substrate 101 and first bond sites 112a on the first die 102a. Second wirebonds 110b extend between second terminals 108b on the substrate 101 and second bond sites 112b on the second die 102b. The package 100 also includes a plurality of solder balls 114 attached to a second surface 101b of the substrate 101. A plurality of traces 116 of the substrate 101 electrically couple individual solder balls 114 to the first and second terminals 108a and 108b.

The microelectronic device package 100 typically has a large footprint to accommodate the wirebonding of the second die 102b to the substrate 101. As shown in FIG. 1, the second wirebonds 110b must have sufficient clearance from the first die 102a and/or the first wirebonds 110a for the package 100 to function properly. To have sufficient clearance, the second wirebonds 110b need to have a large loop height, and the first and second terminals 108a and 108b need to have a large separation therebetween. Thus, the package 100 typically has both a large height H and a large width W that result in a large footprint. Accordingly, there is a need for structural arrangements that can reduce the footprint of microelectronic device packages.

DETAILED DESCRIPTION

Specific details of several embodiments of the disclosure are described below with reference to microelectronic device packages with small footprints and associated methods of manufacturing. Typical microelectronic device packages include microelectronic circuits or components, thin-film recording heads, data storage elements, microfluidic devices, and other components manufactured on microelectronic substrates. Micromachines and micromechanical devices are included within this definition because they are manufactured using technology similar to that used in the fabrication of integrated circuits. Substrates can be semiconductor pieces (e.g., doped silicon wafers or gallium arsenide wafers), non-conductive pieces (e.g., various ceramic substrates), or conductive pieces. A person skilled in the relevant art will also understand that the disclosure may have additional embodiments, and that the disclosure may be practiced without several of the details of the embodiments described below with reference to FIGS. 2-6.

Figure 2:
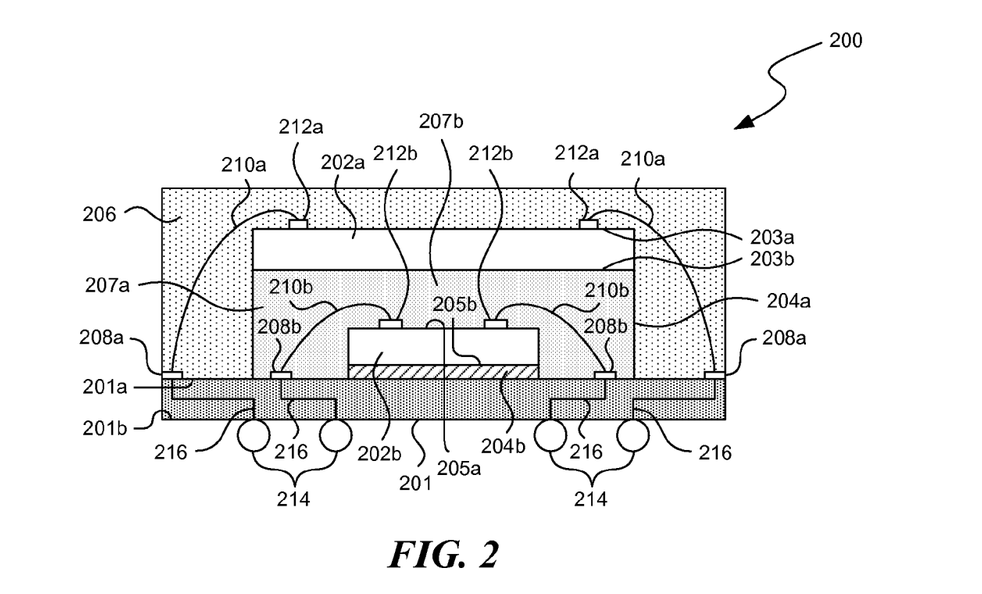
FIG. 2 is a partially schematic cross-sectional view of a microelectronic device package having a small footprint in accordance with an embodiment of the disclosure.

FIG. 2 is a partially schematic cross-sectional view of a microelectronic device package 200 having a small footprint in accordance with an embodiment of the disclosure. As shown in FIG. 2, the microelectronic device package 200 can include a substrate 201, a first die 202a and a second die 202b carried by the substrate 201, and an encapsulant 206 encapsulating the first and second dies 202a and 202b. The substrate 201 can include first terminals 208a that are outboard of second terminals 208b on a first surface 201a. The substrate 201 can also carry a plurality of solder balls 214 on a second surface 201b opposite the first surface 201a. A plurality of traces 216 of the substrate 201 electrically couple individual solder balls 214 to the first and second terminals 208a and 208b.

The first die 202a includes a first active surface 203a opposite a first backside surface 203b. The second die 202b includes a second active surface 205a opposite a second backside surface 205b. The first die 202a can be an upper die, and the second die 202b can be a lower die. The first die 202a has a first footprint (e.g., as characterized by a width, a length, a diameter, and/or another dimension) larger than a second footprint of the second die 202b. In certain embodiments, the second footprint of the second die 202b can be substantially within the first footprint of the first die 202a. For example, in the illustrated embodiment, the first and second footprints are generally centered relative to each other. In other embodiments, the second footprint may be offset from the first footprint of the first die 202a. In a particular embodiment, the first die 202a includes a memory device (e.g., DRAM), and the second die 202b includes a logic processor and/or other suitable processing components. In other embodiments, the first and second dies 202a and 202b can include other electrical and/or mechanical components.

The microelectronic device package 200 can also include first wirebonds 210a between first terminals 208a on the substrate 201 and first bond sites 212a on the first die 202a. Second wirebonds 210b extend between second terminals 208b on the substrate 201 and second bond sites 212b on the second die 202b. The first wirebonds 210a are outboard of the corresponding second wirebonds 210b. The first wirebonds 210a also have a first wirebond length greater than a second wirebond length of the second wirebonds 210b.

The microelectronic device package 200 can also include a first adhesive 204a and a second adhesive 204b. The first adhesive 204a is disposed between the first backside surface 203b of the first die 202a and the second active surface 205a of the second die 202b. The first adhesive 204a is also disposed between the first surface 201a of the substrate 201 and the perimeter portion of the first backside surface 203b that extends laterally beyond the second footprint of the second die 202b. The second adhesive 204b (e.g., an epoxy) is disposed between the second backside 205b of the second die 202b and the first surface 201a of the substrate 201. In certain embodiments, the first adhesive 204a can include a film-over-wire adhesive and/or other suitable types of adhesive. One suitable film-over-wire adhesive includes a die-attach film (Model No. ELEP MOUNT EM-310) provided by Nitto Denko Corp. of Osaka, Japan. In other embodiments, the first adhesive 204a can include an epoxy and/or other non-conductive material.

In certain embodiments, the first adhesive 204a can substantially or even completely encapsulate the second die 202b, the second wirebonds 210b, the second bond sites 212b, and the second terminals 208b. For example, the first adhesive 204a can include a first portion 207a adjacent to and outboard of a second portion 207b. The first portion 207a is between the first die 202a and the substrate 201. The second portion 207b is between the first die 202a and the second die 202b and generally corresponds to the second footprint of the second die 202b. The first portion 207a couples the first die 202a to the substrate 201, and the second portion 207b couples the first die 202a to the second die 202b. The first portion 207a has a thickness greater than that of the second portion 207b.

The first adhesive 204a can have an overall height greater than the combined height of the second die 202b, the second adhesive 204b, and the loop height of the second wirebonds 210b. The phrase "loop height" generally refers to the height between the top of a wirebond and the surface of a corresponding die. The first adhesive 204a can also have an overall width greater than that of the second die 202b and the distance between the second terminals 208a such that the second terminals 208a are at least proximately inboard of the first die 202a. In the illustrated embodiment, the first adhesive 204a has a footprint generally equal to that of the first die 202a. In other embodiments, the first adhesive 204a can also have a footprint that is greater or less than that of the first die 202a. In further embodiments, the first adhesive 204a can partially encapsulate at least one of the second terminals 208b and the second wirebonds 210b. In yet further embodiments, the package 200 can include additional non-conductive layers between the first and second dies 202a and 202b, as described in more detailed below with reference to FIG. 4.

Several embodiments of the package 200 can have a smaller footprint and shorter wirebond lengths than in conventional packages (e.g., the package 100 shown in FIG. 1) because the second wirebonds 210b are inboard of the first wirebonds 210a. For example, the width of the package 200 and the length of the second wirebonds 210b can be reduced because the second wirebonds 210b do not extend outward beyond the first wirebonds 210a. The height of the package 200 can also be reduced because the second wirebonds 210b need not clear the first wirebonds 210a.

Several embodiments of the package 200 can also enable wirebonding the second die 202b with a bond site layout that is more flexible than in conventional packages. For example, in the package 100 of FIG. 1, the second die 102b is typically positioned at a corner of the first die 102a to enable ready wirebonding to the substrate 101 (FIG. 1). As a result, the second die 102b typically has an "I" shaped or an "L" shaped bond site layout, which may limit the overall wiring layout of the package 100. Accordingly, by positioning the second die 202b inboard the first die 202a, the second die 202b can have any desired bond site layouts. For example, the second die 202b can have bond sites substantially around its entire periphery.

Several embodiments of the package 200 can further reduce electrical and/or electromagnetic interference between the first and second dies 202a and 202b. The inventors have recognized that the second die 102b in FIG. 1 positioned proximate to an edge of the first die 102a can cause a shift in supply and/or signal voltage in peripheral circuits in the first die 102a, and thus adversely affect the performance of the package 100. Accordingly, by positioning the second die 202b away from the edges of the first die 202a, such electrical and/or electromagnetic interference can be at least reduced.

Figure 3A:
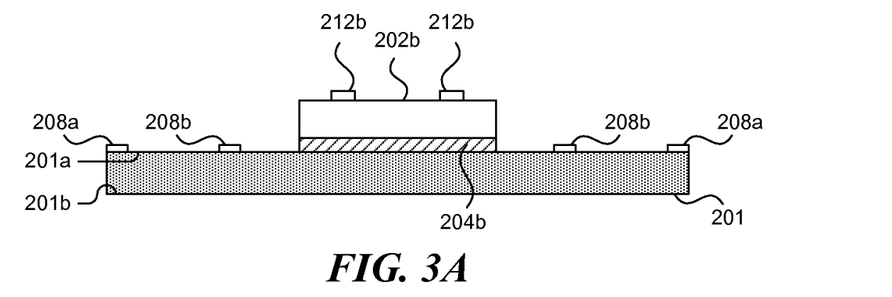
FIGS. 3A-3D illustrate a process of forming the microelectronic device package shown in FIG. 2 in accordance with an embodiment of the disclosure.
Figure 3B:
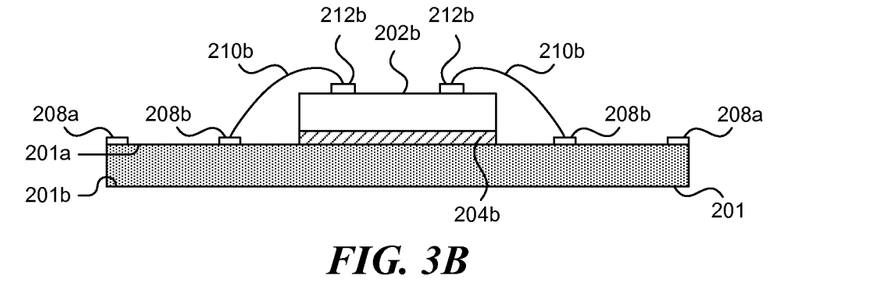

FIGS. 3A-3D illustrate stages of a process for forming the microelectronic device package 200 of FIG. 2 in accordance with an embodiment of the disclosure. FIG. 3A illustrates an early stage of the process that includes attaching the second die 202b to the first surface 201a of the substrate 201 with the second adhesive 204b. FIG. 3B illustrates a subsequent stage of the process that includes wirebonding the second die 202b to the substrate 201. As a result, the second wirebonds 210b extend between the second bond sites 212b and the corresponding second terminals 208b.

Figure 3C:
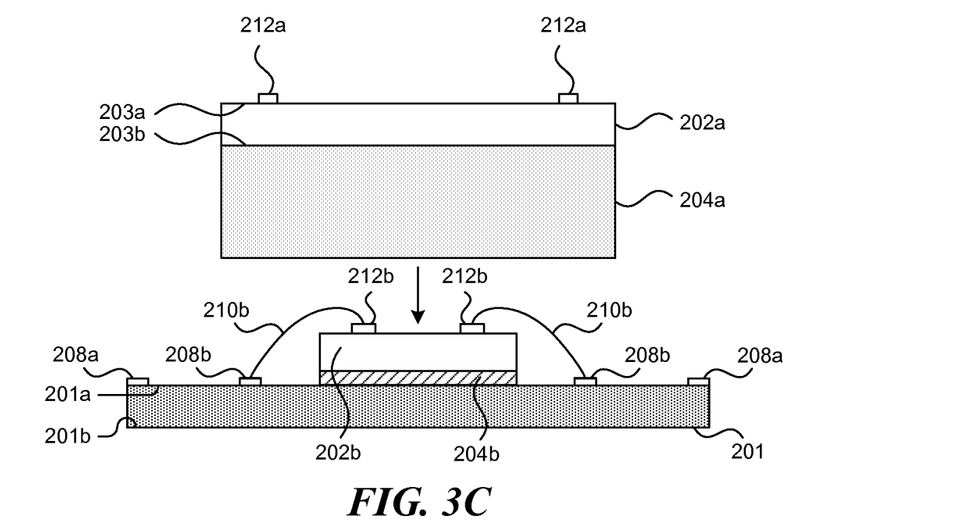

FIG. 3C illustrates another stage of the process that includes applying the first adhesive 204a to the first backside surface 203b of the first die 202a and attaching the first die 202a to the substrate 201 such that the first die 202a is above the second die 202b with the first adhesive 204a therebetween. The first adhesive 204a can include a film-over-wire adhesive and/or other suitable non-conductive material. In one embodiment, the first adhesive 204a can be applied at a temperature of about 120° C. and can be cooled and/or otherwise hardened after being placed on the second die 202b. In other embodiments, the first adhesive 204a can be applied at other suitable temperatures. In any of the foregoing embodiments, the first adhesive 204a can at least partially encapsulate the second die 202b, the second wirebonds 210b, and the second bond sites 212b.

Figure 3D:
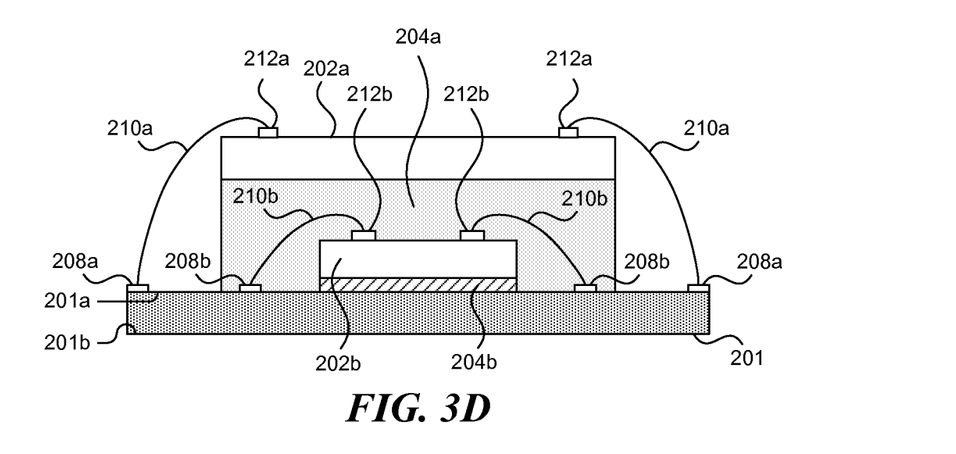

As illustrated in FIG. 3D, further stages of the process can include wirebonding the first die 202a to the substrate 201. As a result, the first wirebonds 210a extend between the first bond sites 212a and the corresponding first terminals 208a. The process can further include encapsulating the first die 202a, the second die 202b, and the substrate 201 in the encapsulant 206 utilizing injection molding and/or another suitable encapsulating process and attaching the solder balls 214 to the second surface 201b of the substrate 201, as shown in FIG. 2.

Several embodiments of the process described above with reference to FIGS. 3A-3D can reduce the risk of mold voiding in manufacturing the package 200. The inventors have recognized that the pyramid-like arrangement of the first and second dies 102a and 102b of FIG. 1 may disrupt the laminar flow of the encapsulant 106 during a molding process. This disruption can form voids in the encapsulant 106, and thus reduce the structural integrity of the package 100. As a result, by encapsulating the second die 202b within the first adhesive 204a, the disruption to the laminar flow of the encapsulant 206 can be reduced or avoided.

Figure 4:
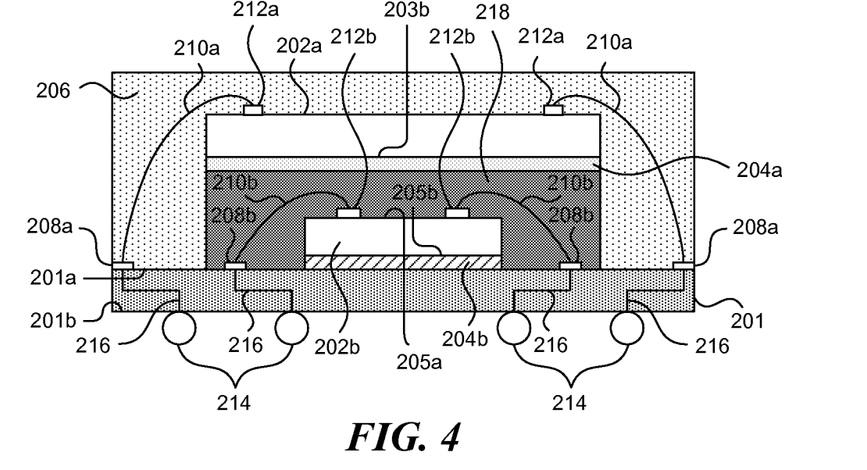
FIG. 4 is a partially schematic cross-sectional view of a microelectronic device package having a small footprint in accordance with another embodiment of the disclosure.

The process described above with reference to FIGS. 3A-3D can have additional and/or different process stages. For example, in certain embodiments, the first adhesive 204a does not completely encapsulate the second die 202b, the second wirebonds 210b, and the second bond sites 212b. Instead, as illustrated in FIG. 4, a non-conductive layer 218 (e.g., an epoxy) is formed between the first and second dies 202a and 202b via injection molding, transfer molding, and/or another suitable encapsulation process. The non-conductive layer 218 can at least partially encapsulate the second die 202b, the second wirebonds 210b, and the second bond sites 212b. The process can then include attaching the first die 202a to the non-conductive layer 218 with the first adhesive 204a. In certain embodiments, the non-conductive layer 218 can have a composition different than the first adhesive 204a. In other embodiments, the non-conductive layer 218 can have a composition that is at least generally similar to the first adhesive 204a.

Figure 5:
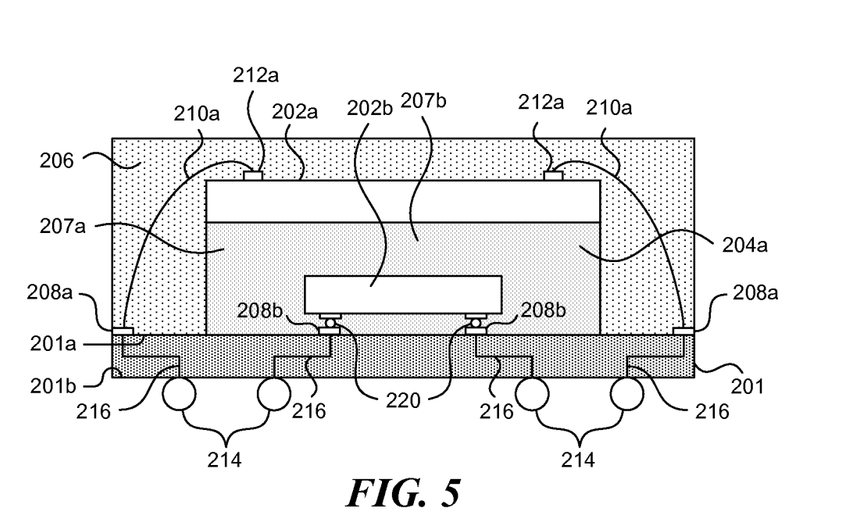
FIG. 5 is a partially schematic cross-sectional view of a microelectronic device package having a small footprint in accordance with a further embodiment of the disclosure.
Figure 6:
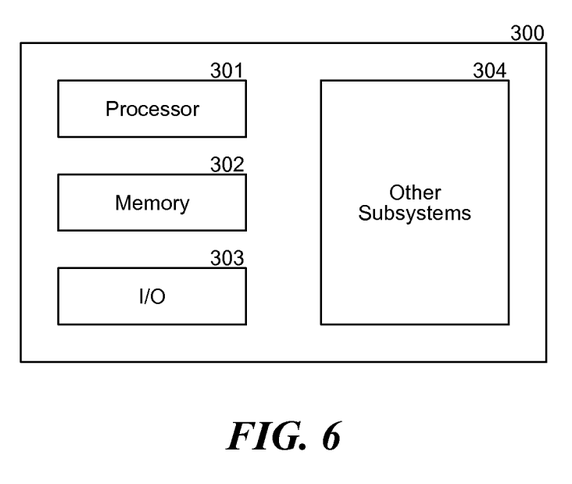
FIG. 6 is a schematic diagram of a system that includes one or more microelectronic device packages in accordance with embodiments of the disclosure.

In further embodiments, the first die 202a, the second die 202b, and the substrate 201 can have other arrangements. For example, as illustrated in FIG. 5, the second die 202b can have a flip-chip arrangement relative to the substrate 201. A plurality of conductive members 220 (e.g., solder balls, solder bumps, or pillar bumps) can couple the second bond sites 212b of the second die 202b to the second terminals 208b on the substrate 201. As a result, the second wirebonds 210b (FIG. 2) can be omitted. In yet further embodiments, the package 200 can have other desired arrangements.

Even though only one first die 202a is illustrated in FIGS. 2-5, in certain embodiments, the package 200 can include two, three, four, and/or any desired number of first dies 202a attached to one another with an adhesive in a stacked arrangement. In further embodiments, the package 200 can also include additional second dies 202b. For example, one second die 202b can be disposed below the first die 202a and another second die 202b can disposed above the first die 202a. In further embodiments, multiple first and second dies 202a and 202b can be arranged alternatively in a stack.

Individual microelectronic device packages 200 may be incorporated into myriad larger and/or more complex systems. A representative system 300 is shown schematically in FIG. 6. The system 300 can include a processor 301, a memory 302, input/output devices 303, and/or other subsystems or components 304. The resulting system 300 can perform a wide variety of computing, processing, storage, sensor, and/or other functions. Accordingly, the representative system 300 can include, without limitation, computers and/or other data processors, for example, desktop computers, laptop computers, Internet appliances, and hand-held devices (e.g., palm-top computers, wearable computers, cellular or mobile phones, multi-processor systems, processor-based or programmable consumer electronics, network computers, mini computers). The representative system 300 can also include servers and associated server subsystems, display devices, and/or memory devices. Components of the system 300 may be housed in a single unit or distributed over multiple, interconnected units, e.g., through a communications network. Components can accordingly include local and/or remote memory storage devices and any of a wide variety of computer-readable media, including magnetic or optically readable or removable computer disks.

From the foregoing, it will be appreciated that specific embodiments of the disclosure have been described herein for purposes of illustration, but that various modifications may be made without deviating from the disclosure. For example, many of the members of one embodiment may be combined with other embodiments in addition to or in lieu of the members of the other embodiments. Accordingly, the disclosure is not limited except as by the appended claims.

We claim:

1. A method for assembling a microelectronic device package, comprising:

applying an adhesive to a first backside surface of a first die, the first die having a first active surface opposite the first backside surface and a first bond site on the first active surface;

attaching a second die to a surface of a substrate, the second die having a second active surface facing the surface of the substrate, a second backside surface facing the first backside surface, and a second bond side on the second active surface, wherein the substrate includes a first terminal and a second terminal on the surface of the substrate, and wherein the first terminal is outboard of the second terminal;

coupling the second bond site of the second die to the second terminal with a solder ball;

positioning the first backside surface of the first die to be superimposed with the second die with the adhesive applied on the first backside surface, wherein the adhesive is a non-conductive material; and at least substantially encapsulating the second die with the adhesive on the first backside surface of the first die such that the adhesive has a first portion between the surface of the substrate and the first backside surface of the first die and a second portion between the first die and the second die such that the first and second portions of the adhesive are composed of the same material, wherein the first backside surface of the first die is spaced apart from the second die, and wherein the adhesive directly contacts the second backside surface of the second die; and placing a wirebond between the first terminal and the first bond site.

2. The method of claim 1 wherein applying an adhesive includes applying an adhesive having a footprint generally equal to a first footprint of the first die to the first backside surface of the first die, and wherein substantially encapsulating the second die includes substantially encapsulating the second die with the adhesive on the first backside surface of the first die, the second die having a second footprint less than the first footprint.

3. The method of claim 1 wherein applying an adhesive includes applying an adhesive having a footprint generally equal to a first footprint of the first die to the first backside surface of the first die, and wherein substantially encapsulating the second die includes substantially encapsulating the second die with the adhesive on the first backside surface of the first die, the second die having a second footprint less than and within the first footprint.

4. The method of claim 1 wherein applying an adhesive includes applying an adhesive having a footprint generally equal to a first footprint of the first die to the first backside surface of the first die, and wherein substantially encapsulating the second die includes substantially encapsulating the second die with the adhesive on the first backside surface of the first die, the second die having a second footprint less than and generally centered with the first footprint.

5. The method of claim 1 wherein the first and second dies are two of a plurality of at least eight dies, and wherein the method further comprises positioning the third through eighth dies sequentially on each other on the active surface of the first die.

6. The method of claim 1, further comprising disposing an encapsulant over the first and second dies after the first die is attached to the second die.

* * * * *